(12) United States Patent
Zhu et al.

(10) Patent No.: US 9,349,867 B2
(45) Date of Patent: May 24, 2016

(54) SEMICONDUCTOR DEVICES AND METHODS FOR MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Miao Xu, Beijing (CN); Qingqing Liang, Lagrangeville, NY (US); Haizhou Yin, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/434,437

(22) PCT Filed: Dec. 4, 2012

(86) PCT No.: PCT/CN2012/085817
§ 371 (c)(1),
(2) Date: Apr. 9, 2015

(87) PCT Pub. No.: WO2014/071665
PCT Pub. Date: May 15, 2014

(65) Prior Publication Data
US 2015/0255609 A1    Sep. 10, 2015

(30) Foreign Application Priority Data
Nov. 9, 2012 (CN) .......................... 2012 1 0448686

(51) Int. Cl.
*H01L 27/088* (2006.01)
*H01L 29/78* (2006.01)
(Continued)

(52) U.S. Cl.
CPC ........ *H01L 29/7851* (2013.01); *H01L 21/0257* (2013.01); *H01L 21/02274* (2013.01);
(Continued)

(58) Field of Classification Search
CPC ............ H01L 29/7851; H01L 29/0653; H01L 29/1083; H01L 21/823431; H01L 21/823821; H01L 21/02488; H01L 21/02532; H01L 21/0257; H01L 21/26513; H01L 21/76224; H01L 27/0886; H01L 27/0924
USPC ......................................................... 257/401
See application file for complete search history.

(56) References Cited

U.S. PATENT DOCUMENTS

2004/0219722 A1    11/2004  Pham et al.
2006/0208300 A1*   9/2006   Iwanaga .......... H01L 21/823431
                                              257/308

(Continued)

FOREIGN PATENT DOCUMENTS

CN          1890816 A       1/2007
CN        101404257 A       4/2009
(Continued)

*Primary Examiner* — Tu-Tu Ho
(74) *Attorney, Agent, or Firm* — Christensen Fonder P.A.

(57) ABSTRACT

Provided are semiconductor devices and methods for manufacturing the same. An example method may include: forming a first semiconductor layer and a second semiconductor layer sequentially on a substrate; patterning the second semiconductor layer and the first semiconductor layer to form a fin; forming an isolation layer on the substrate, wherein the isolation layer exposes a portion of the first semiconductor layer; implanting ions into a portion of the substrate beneath the fin, to form a punch-through stopper; forming a gate stack crossing over the fin on the isolation layer; selectively etching the second semiconductor layer with the gate stack as a mask, to expose the first semiconductor layer; selectively etching the first semiconductor layer, to form a void beneath the second semiconductor layer; and forming a third semiconductor layer on the substrate, to form source/drain regions.

20 Claims, 14 Drawing Sheets

(51) Int. Cl.

| | |
|---|---|
| *H01L 21/8238* | (2006.01) |
| *H01L 27/092* | (2006.01) |
| *H01L 21/02* | (2006.01) |
| *H01L 21/265* | (2006.01) |
| *H01L 21/306* | (2006.01) |
| *H01L 21/308* | (2006.01) |
| *H01L 21/762* | (2006.01) |
| *H01L 21/8234* | (2006.01) |
| *H01L 29/06* | (2006.01) |
| *H01L 29/10* | (2006.01) |
| *H01L 29/161* | (2006.01) |
| *H01L 29/66* | (2006.01) |
| *H01L 29/165* | (2006.01) |

(52) U.S. Cl.
CPC .... *H01L21/02381* (2013.01); *H01L 21/02488* (2013.01); *H01L 21/02532* (2013.01); *H01L 21/26513* (2013.01); *H01L 21/308* (2013.01); *H01L 21/30604* (2013.01); *H01L 21/76224* (2013.01); *H01L 21/823431* (2013.01); *H01L 21/823481* (2013.01); *H01L 21/823821* (2013.01); *H01L 27/0886* (2013.01); *H01L 27/0924* (2013.01); *H01L 29/0653* (2013.01); *H01L 29/1083* (2013.01); *H01L 29/161* (2013.01); *H01L 29/6681* (2013.01); *H01L 29/165* (2013.01); *H01L 29/7848* (2013.01)

(56) References Cited

U.S. PATENT DOCUMENTS

| | | |
|---|---|---|
| 2006/0244051 A1 | 11/2006 | Izumida et al. |
| 2007/0132009 A1 | 6/2007 | Takeuchi et al. |
| 2009/0090934 A1 | 4/2009 | Tezuka et al. |
| 2011/0298050 A1 | 12/2011 | Luo et al. |
| 2014/0099763 A1* | 4/2014 | Alptekin ........... H01L 21/02529 438/283 |

FOREIGN PATENT DOCUMENTS

| | | |
|---|---|---|
| CN | 102104069 A | 6/2011 |
| CN | 102623321 A | 8/2012 |

* cited by examiner (a)

(b)

(a)

(b)

SEMICONDUCTOR DEVICES AND METHODS FOR MANUFACTURING THE SAME

CROSS-REFERENCE TO RELATED APPLICATIONS

This application is a U.S. national phase application of PCT Application No. PCT/CN2012/085817, filed on Dec. 4, 2012, entitled "Semiconductor Devices and Methods for Manufacturing the Same," which claims priority to Chinese Patent Application No. 201210448686.1, filed on Nov. 9, 2012. Both the PCT Application and the Chinese Application are incorporated herein by reference in their entireties.

TECHNICAL FIELD

The present disclosure relates to the semiconductor technology, and particularly to semiconductor devices and methods for manufacturing the same.

BACKGROUND

Short channel effects are getting more significant as planar semiconductor devices are increasingly being scaled down. To this end, three-dimensional (3D) semiconductor devices, such as Fin Field Effect Transistors (FinFETs), have been proposed. Generally, a FinFET includes a fin formed vertically on a substrate and a gate stack intersecting the fin. In addition, an isolation layer is formed on the substrate to isolate the gate stack from the substrate. As such, the fin has its bottom surrounded by the isolation layer. Therefore, it is difficult for the gate to effectively control the bottom of the fin. As a result, a leakage current tends to occur between a source and a drain via the bottom of the fin.

SUMMARY OF THE DISCLOSURE

The present disclosure aims to provide, among others, semiconductor devices and methods for manufacturing the same.

According to an aspect of the present disclosure, a method for manufacturing a semiconductor device is provided, comprising: forming a first semiconductor layer and a second semiconductor layer sequentially on a substrate; patterning the second semiconductor layer and the first semiconductor layer to form a fin; forming an isolation layer on the substrate, wherein the isolation layer exposes a portion of the first semiconductor layer; implanting ions into a portion of the substrate beneath the fin, to form a punch-through stopper; forming a gate stack crossing over the fin on the isolation layer; selectively etching the second semiconductor layer with the gate stack as a mask, to expose the first semiconductor layer; selectively etching the first semiconductor layer, to form a void beneath the second semiconductor layer; and forming a third semiconductor layer on the substrate, to form source/drain regions.

According to another aspect of the present disclosure, a semiconductor device is provided, comprising: a fin formed on a substrate; a punch-through stopper formed in the substrate beneath the fin; an isolation layer formed on the substrate; and a gate stack formed on the isolation layer and crossing over the fin, wherein the fin comprises a portion composed of a first semiconductor layer beneath the gate stack and a portion composed of a second semiconductor layer abutting the first semiconductor layer, and wherein the semiconductor device further comprises source/drain regions formed in the portion composed of the second semiconductor layer.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
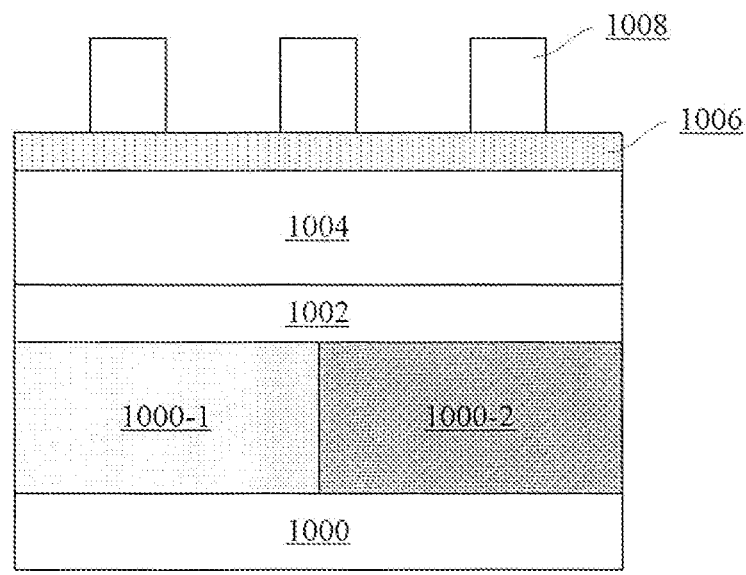
FIGS. 1 to 18 are schematic diagrams showing a flow for manufacturing a semiconductor device according to an embodiment of the present disclosure.

Hereinafter, the technology disclosed herein is described with reference to embodiments thereof shown in the attached drawings. However, it should be noted that those descriptions are just provided for illustrative purpose, rather than limiting the present disclosure. Further, in the following, descriptions of known structures and techniques are omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a relatively high threshold voltage region may be formed in a substrate beneath a fin, to reduce the source/drain leakage. In an example, the relatively high threshold voltage region may include a relatively highly-doped region, or a punch-through stopper. The punch-through stopper may be formed by implanting ions into the substrate beneath the fin after the fin is formed. For example, p-type implantation may be performed for an n-type device; or n-type implantation may be performed for a p-type device.

Due to the ion implantation, a relatively high dopant concentration may exist in the fin (especially in the bottom of the fin close to the ion implanted region). This in turn results in great random doping fluctuation in the fin, thereby degrading device performances. According to an embodiment of the present disclosure, the fin may be formed in such way that the fin includes a stack of a sacrificial layer and a fin body layer, wherein the sacrificial layer is located at the bottom of the fin. After the ion implantation for forming the punch-through stopper, the sacrificial layer, which is potentially contaminated by the ion implantation, may be selectively removed. Therefore, the random doping fluctuation in the fin may be reduced, thereby further improving the device performances.

According to another embodiment of the present disclosure, to further reduce the source/drain leakage, after the sacrificial layer is removed as described above, an isolation island may be formed between a source and a drain at the bottom of the fin, to reduce a leakage current between the source and the drain via the bottom of the fin. For example, after the sacrificial layer is removed, a dielectric material may be filled beneath the fin body layer and patterned into an isolation island.

As it is desirable to locate the isolation island between the source and the drain, a gate stack may be used as a mask in patterning the isolation island. Specifically, after the sacrificial layer and the fin body layer are patterned into a fin, an isolation layer may be formed on the substrate and a (sacrificial) gate stack crossing over the fin may formed on the isolation layer. The isolation layer exposes a portion of the sacrificial layer, because the isolation layer defines the "bottom" of the fin. Then, the fin body layer may be selectively etched with the (sacrificial) gate stack as a mask (thereby leaving the fin body layer beneath the gate stack), to expose the sacrificial layer. Next, the sacrificial layer may be selectively etched to remove the sacrificial layer (for example, the sacrificial layer may be removed completely). As such, a void is formed beneath the fin body layer. Next, a dielectric material may be deposited and etched back (with the gate stack as a mask), so that the void beneath the fin body layer is filled with the dielectric material to form an isolation island.

On the other hand, after the sacrificial layer is removed as described above, an opening having a shape corresponding to that of the fin is formed in the isolation layer and exposes a portion of the substrate. Then, source/drain regions may be formed on the substrate through the opening by, for example, epitaxy.

According to another embodiment of the present disclosure, the formed source/drain regions may comprise a semiconductor material different from that of the fin body layer, and thus can apply stress to the fin body layer (in which a channel region is to be formed) due to mismatch of lattices between the source/drain regions and the fin body layer, thereby further improving the device performances.

According to an embodiment of the present disclosure, the isolation layer may be formed by depositing a dielectric material on the substrate and then etching it back. The dielectric material may be formed in such way that when the dielectric material substantially covers the fin (i.e., in case of multiple fins, substantially fills up gaps between the fins), a portion of the dielectric material on top of the fin may have a thickness sufficiently less than that of a portion of the dielectric material on the substrate. For example, the portion of the dielectric material on top of the fin may have a thickness less than ⅓, preferably ¼, of the thickness of the portion of the dielectric material on the substrate. This may be implemented by, for example, High Density Plasma (HDP) deposition. In case of forming a plurality of fins, a portion of the dielectric material on top of each of the fins may have a thickness less than half of a spacing between the fin and its neighboring fin. As such, an etching depth may be reduced in the subsequent etching-back process, and thus accuracy for controlling the etching may be improved.

The present disclosure may be presented in various forms, and some examples thereof will be described hereafter.

As shown in FIG. 1, a substrate 1000 is provided. The substrate 1000 may comprise any substrate in various forms, for example, but not limited to, bulk semiconductor substrate such as bulk Si substrate, Semiconductor On Insulator (SOI) substrate, SiGe substrate and the like. In the following, a bulk Si substrate is described by way of example for convenience of description.

An n-type well 1000-1 and a p-type well 1000-2 may be formed in the substrate 1000, so that a p-type device and an n-type device may be formed later therein, respectively. For example, the n-type well 1000-1 may be formed by implanting n-type dopants (such as P or As) into the substrate 1000, and the p-type well 1000-2 may be formed by implanting p-type dopants (such as B) into the substrate 1000. If required, annealing may be performed after the implantation. To those skilled in the art, the n-type and p-type wells may be formed in various methods, and detailed descriptions thereof will be omitted here.

It is to be noted that a process of forming complementary devices in the respective n-type and p-type wells will be described below, but the present disclosure is not limited thereto. The present disclosure is also applicable to a non-complementary process, for example. Further, some of the following processes related to the complementary devices may not be necessary in some implementations.

A first semiconductor layer 1002 may be formed on the substrate 1000 by, for example, epitaxy. In an example, the first semiconductor layer 1002 may comprise SiGe (wherein Ge may have an atomic percentage of about 5-20%), with a thickness of about 10-50 nm. Next, a second semiconductor layer 1004 may be formed by, for example, epitaxy on the first semiconductor layer 1002. In an example, the second semiconductor layer 1004 may comprise Si with a thickness of about 20-100 nm.

In an example of the present disclosure, a protection layer 1006 may be formed on the second semiconductor layer 1004. For example, the protection layer 1006 may comprise oxide (for example, silicon oxide) with a thickness of about 10-50 nm. Such a protection layer 1006 can protect end portions of fins in subsequent processes.

The formed second semiconductor layer 1004, first semiconductor layer 1002, and substrate may be then patterned to form the fins. For example, this can be done as follows. In particular, photoresist 1008 may be formed and then patterned as designed on the protection layer 1006. The photoresist 1008 is generally patterned into a series of parallel equispaced lines. Then, as shown in FIG. 2, the protection layer 1006, the second semiconductor layer 1004, the first semiconductor layer 1002 and the substrate 1000 may be sequentially selectively etched by, for example, Reactive Ion Etching (RIE), with the patterned photoresist 1008 as a mask, thereby forming the fins.

Figure 3:
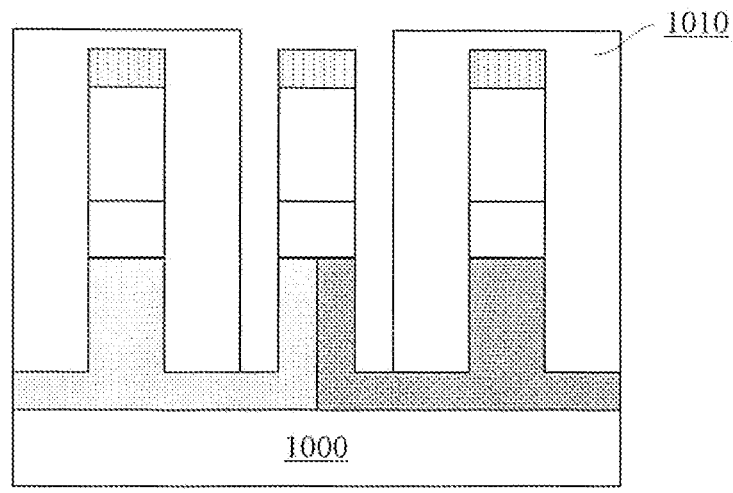

In case of the complementary process, an isolation may be formed between the n-type and p-type regions as shown in FIG. 3. In particular, photoresist 1010 may be formed on the substrate, and then patterned to expose a region around an interface between the n-type and p-type regions. Then, portions of the protection layer and the second and first semiconductor layers existing in this region are selectively etched by, for example, RIE. The substrate may be further selectively etched by, for example, RIE. As such, an isolation zone is formed between the n-type and p-type regions, and may subsequently be filled with dielectric. Then, the photoresist 1010 may be removed.

Figure 2:
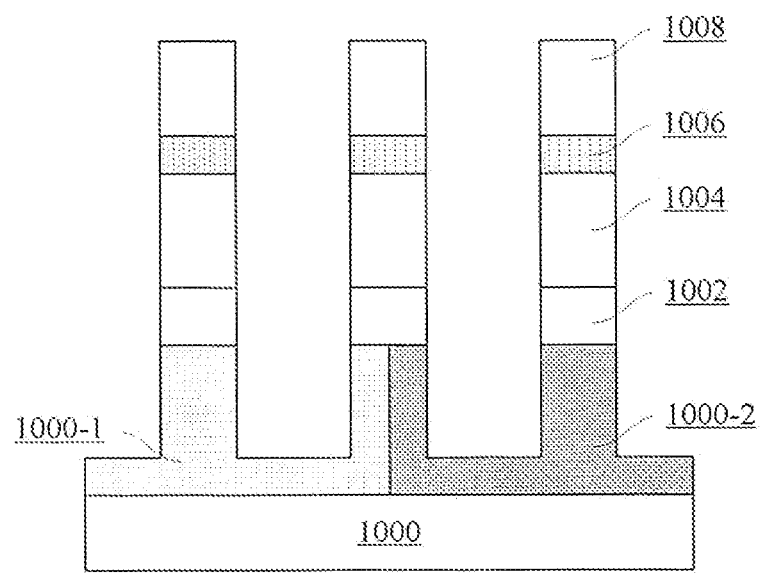

It can be seen that in the process of FIG. 2, the etching for forming the fins is performed into the substrate 1000. Then, with the process of FIG. 3, a contact area between the p-type and n-type wells (i.e., an area of a resultant pn junction) may be made small. However, the present disclosure is not limited thereto. For example, in the non-complementary process or in a local region of devices of a single type (p-type or n-type), the etching of the first semiconductor layer 1002 as described above in conjunction with FIG. 2 may stop on the substrate 1000, and it is not necessary to further etch the substrate 1000; and the process of FIG. 3 may be performed but may not be necessary. Trenches (between the fins) formed by the etching may have a shape different from the regular rectangular shape as shown in FIG. 2, such as a tapered shape narrowed from top down. In addition, the positions and number of the formed fins are not limited to the example as shown in FIG. 2.

Figure 4:
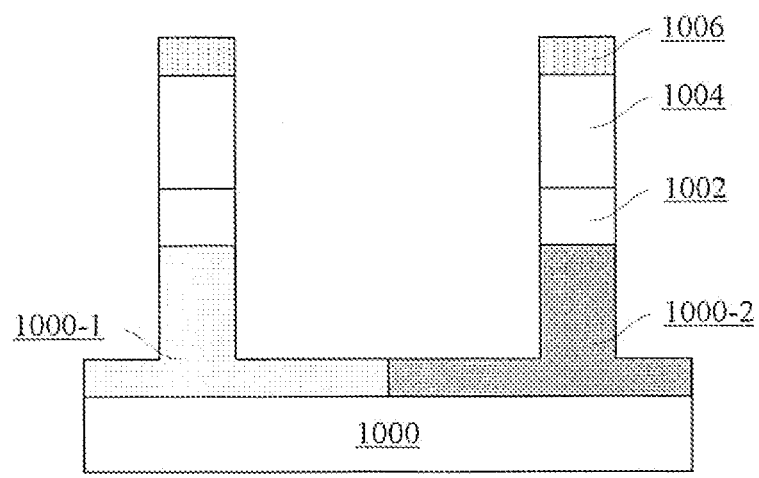

In the example of FIG. 2, a fin is also formed at the interface between the n-type well 1000-1 and the p-type well 1000-2. The fin is then removed by the isolation forming process of FIG. 3, resulting in the structure shown in FIG. 4.

After the fins are formed in the above process, gate stacks crossing over the respective fins may be formed to achieve final semiconductor devices.

To isolate the gate stacks from the substrate, an isolation layer may be formed on the substrate. This isolation layer may be formed by, for example, depositing a dielectric material on the substrate, and then etching it back. In addition, in the etching-back process, an etching depth may be controlled so that the etched isolation layer exposes a portion of the first semiconductor layer (for example, a top surface of the isolation layer may be located between a top surface and a bottom surface of the first semiconductor layer). In an example, the isolation layer may comprise High Density Plasma (HDP) oxide, such as silicon oxide.

Figure 5:
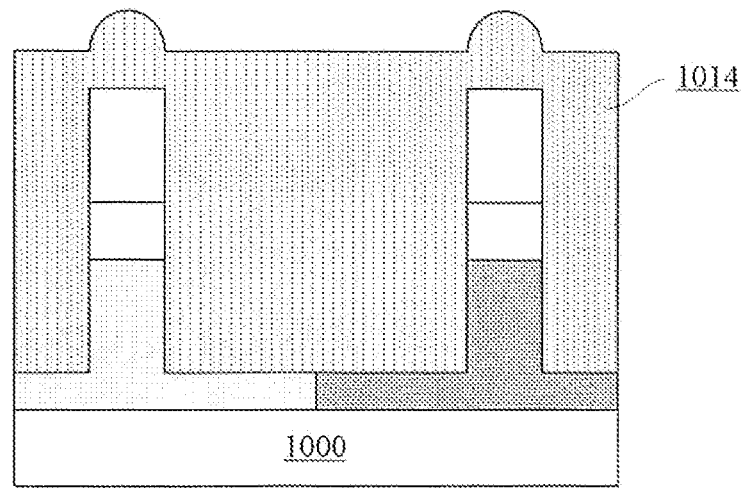

To improve uniformity in level of (the top surface of) the isolation layer after being etched back, and thus improve uniformity in height of finally-formed fins, the dielectric material 1014 may be deposited in such a way that it substantially covers the fins (i.e., in case of multiple fins, substantially fills up gaps between the fins), as shown in FIG. 5. According to embodiments of the present disclosure, the dielectric material may be deposited such that a portion of the dielectric material on top of the fins has a thickness sufficiently less than that of a portion of the dielectric material on the substrate. In general, the thickness of the portion of the dielectric material on top of the fins is less than 1/3, preferably 1/4, of the thickness of the portion of the dielectric material on the substrate. In an example, the portion of the dielectric material on top of each of the fins may have a thickness no more than 20 nm, and the portion of the dielectric material on the substrate may have a thickness up to about 100 nm.

According to an example of the present disclosure, the dielectric material 1014 may comprise oxide (e.g., silicon oxide) formed by High Density Plasma (HDP) deposition. Due to characteristics of HDP, the thickness of the dielectric material on top of the fins (in a direction perpendicular to the substrate) and on side surfaces of the fins (in a direction parallel to the substrate, i.e., a lateral direction) is less than that of the dielectric material between the fins on the substrate (in a direction perpendicular to the substrate) during the deposition. Due to such characteristics, the HDP deposition is conventionally not used to make oxide isolation.

Here, for example, by controlling deposition conditions, the thickness of the portion of the dielectric material 1014 on top of each of the fins may be less than 1/2 of a spacing between the fin and its neighboring fin when the dielectric material 1014 substantially covers the fins (i.e., substantially fills up the gaps between the fins). If spacings between the fins are not the same, the thickness of the portion of the dielectric material 1014 on top of each of the fins may be less than 1/2 of a narrower one of the spacings between the fin and its neighboring fins.

Figure 6:
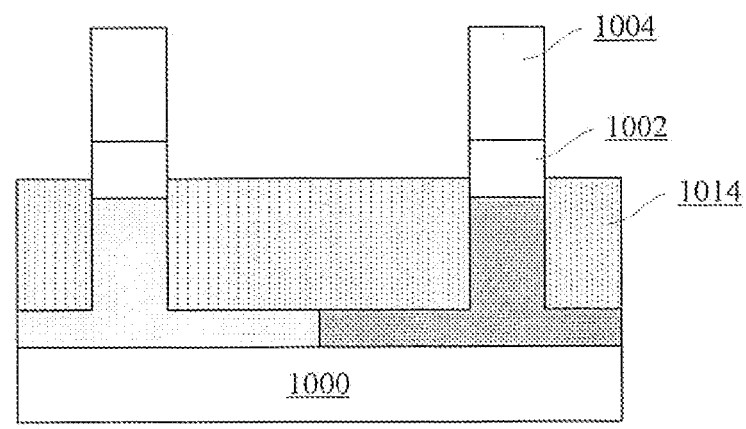

Next, the dielectric material 1014 is etched back as shown in FIG. 6. As the etching-back of the dielectric material 1014 is performed with a relatively small depth, it is easy to control the etching, and it is thus possible to more accurately control a distance from the top surface of the fin (in this example, the top surface of the second semiconductor layer 1004) to the top surface of the isolation layer 1014 (which determines at least partially a fin height of the final device and thus a channel width of the final device), so that the distance is kept substantially constant across the substrate.

In an example, the protection layer 1006 and the dielectric material 1014 comprise the same material, such as oxide. Therefore, in the process of etching back the dielectric material 1014, the protection layer 1016 may be removed at the same time, as shown in FIG. 6.

Figure 7:
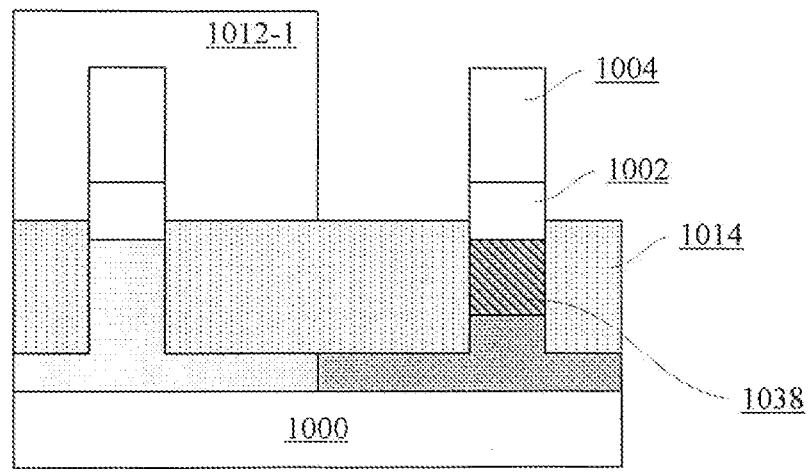

To improve the device performances, a punch-through stopper 1038 may be formed in the substrate beneath the fin. Specifically, as shown in FIG. 7, the n-type well 1000-1. may be covered with photoresist 1012-1, and then ion implantation may be performed. Implanted ions will diffuse into a portion of the substrate surrounded by the isolation layer 1014 via the isolation layer 1014. For the n-type device to be formed in the p-type well 1000-2, p-type dopants such as B, $BF_2$, or In may be implanted. The implantation may be performed at a peak concentration of about 1E18-2E19 $cm^{-3}$, for example. The implanted dopants may be activated through annealing. Then, the photoresist 1012-1 may be removed.

Figure 8:
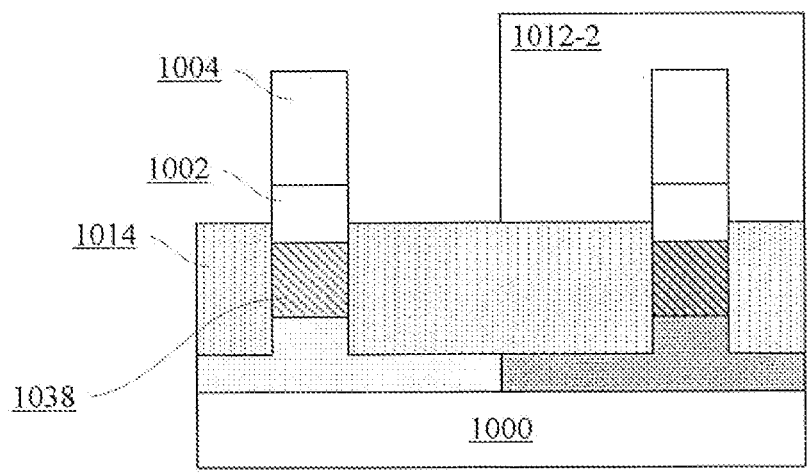

Similarly, as shown in FIG. 8, the p-type well 1000-2 may be covered with photoresist 1012-2, and then (angled) ion implantation may be performed. For the p-type device to be formed in the n-type well 1000-1, n-type dopants such as As or Sb may be implanted. The implantation may be performed at a peak concentration of about 1E18-2E19 $cm^{-3}$, for example. The implanted dopants may be activated through annealing. Then, the photoresist 1012-2 may be removed.

Although the punch-through stopper 1038 is shown in FIGS. 7 and 8 to be located only in the substrate 1000, it may extend into the first semiconductor layer 1002 in practice.

Then, sacrificial gate stacks crossing over the respective fins may be formed on the isolation layer 1014. For example, this may be done as follows.

Figure 9:
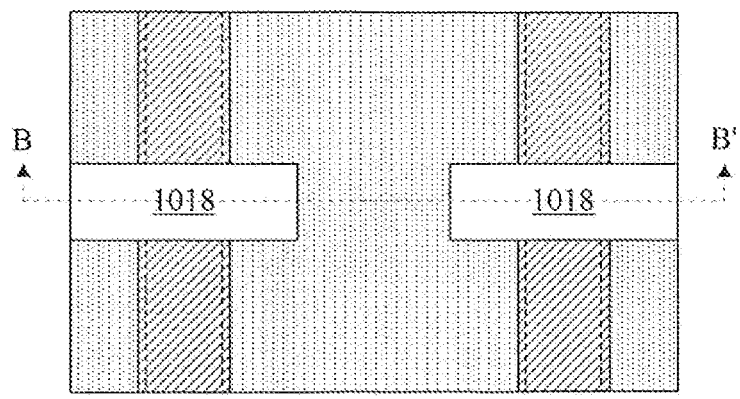
Figure 9:
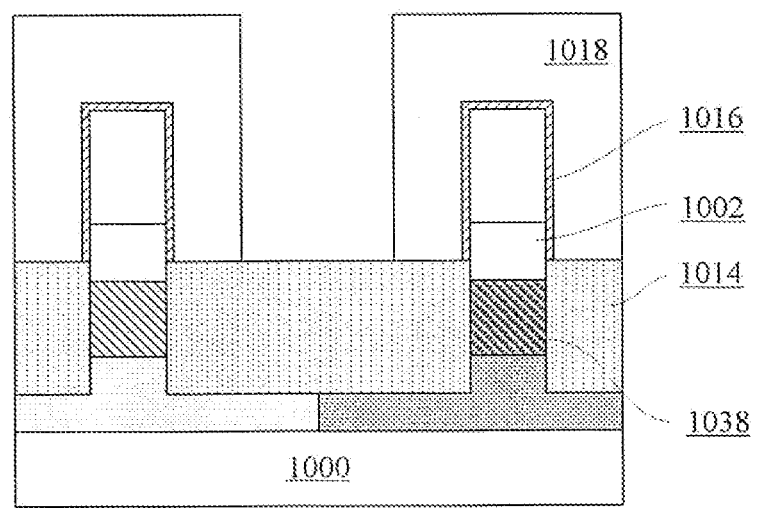

In particular, as shown in FIG. 9 (FIG. 9(b) illustrates a cross-sectional view along line BB' in FIG. 9(a)), a sacrificial gate dielectric layer 1016 may be formed through, for example, deposition. The sacrificial gate dielectric layer 1016 may comprise, for example, oxide with a thickness of about 0.8-1.5 nm. Although the sacrificial gate dielectric layer 1016 is shown in FIG. 9 as a shape of "Π," the sacrificial gate dielectric layer 1016 may also include a portion extending onto the top surface of the isolation layer 1014. Then, a sacrificial gate conductor layer 1018 may be formed by, for example, deposition. The sacrificial gate conductor layer 1018 may comprise, for example, polysilicon. The sacrificial gate conductor layer 1018 may fill up the gaps between the fins, and may be planarized by, for example, Chemical Mechanical Polishing (CMP). Next, the sacrificial gate conductor layer 1018 is patterned to form the gate stacks. The sacrificial gate conductor layer 1018 is patterned into strips intersecting the respective fins in the example of FIG. 9. In another embodiment, the sacrificial gate dielectric layer 1016 may be further patterned with the patterned sacrificial gate conductor layer 1018 as a mask.

Figure 10:
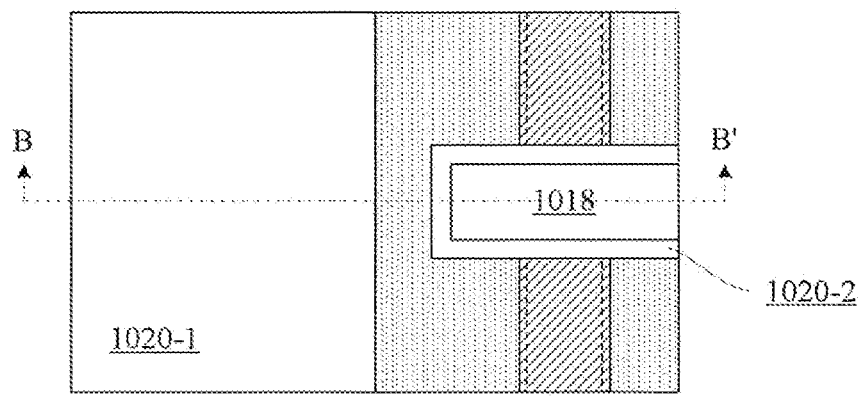
Figure 10:
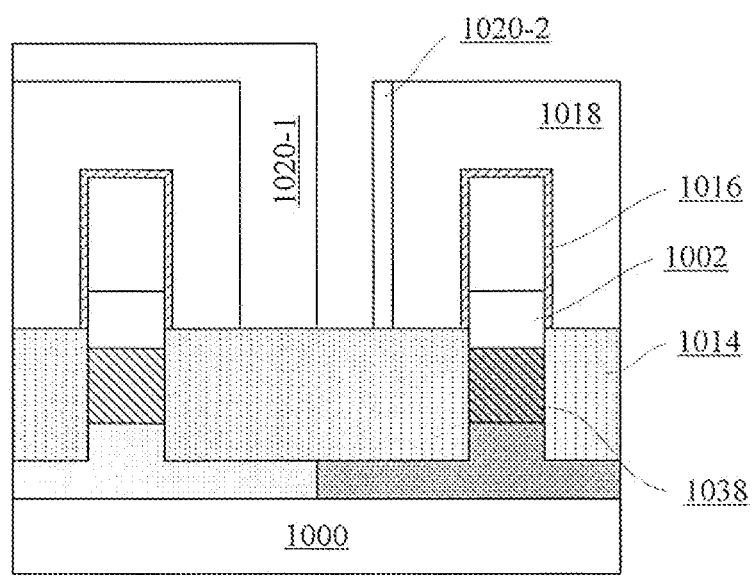

Next, as shown in FIG. 10 (FIG. 10(b) shows a cross-sectional view along line BB' in FIG. 10(a)), a dielectric layer (for example, nitride with a thickness of about 5-30 nm) may be formed on the isolation layer. A portion of the dielectric layer 1020-1 above the n-type well 1000-1 may be covered with photoresist, and a portion of the dielectric layer above the p-type well 1000-2 may be patterned to form a spacer 1020-2. Then the photoresist is removed. There are various approaches for forming such a spacer, and details thereof will be omitted here.

Because the portion of the dielectric layer 1020-1 is relatively thin, a surface thereof may have substantially the same profile as that of the underlying structure. However, for convenience, the surface profile of the portion of the dielectric layer 1020-1 is not shown in FIG. 10(*a*).

The spacer 1020-2 includes substantially no portion formed on side walls of the fins when the trenches between the fins have a tapered shape narrowed from top down (it is generally the case due to characteristics of the etching).

Figure 11:
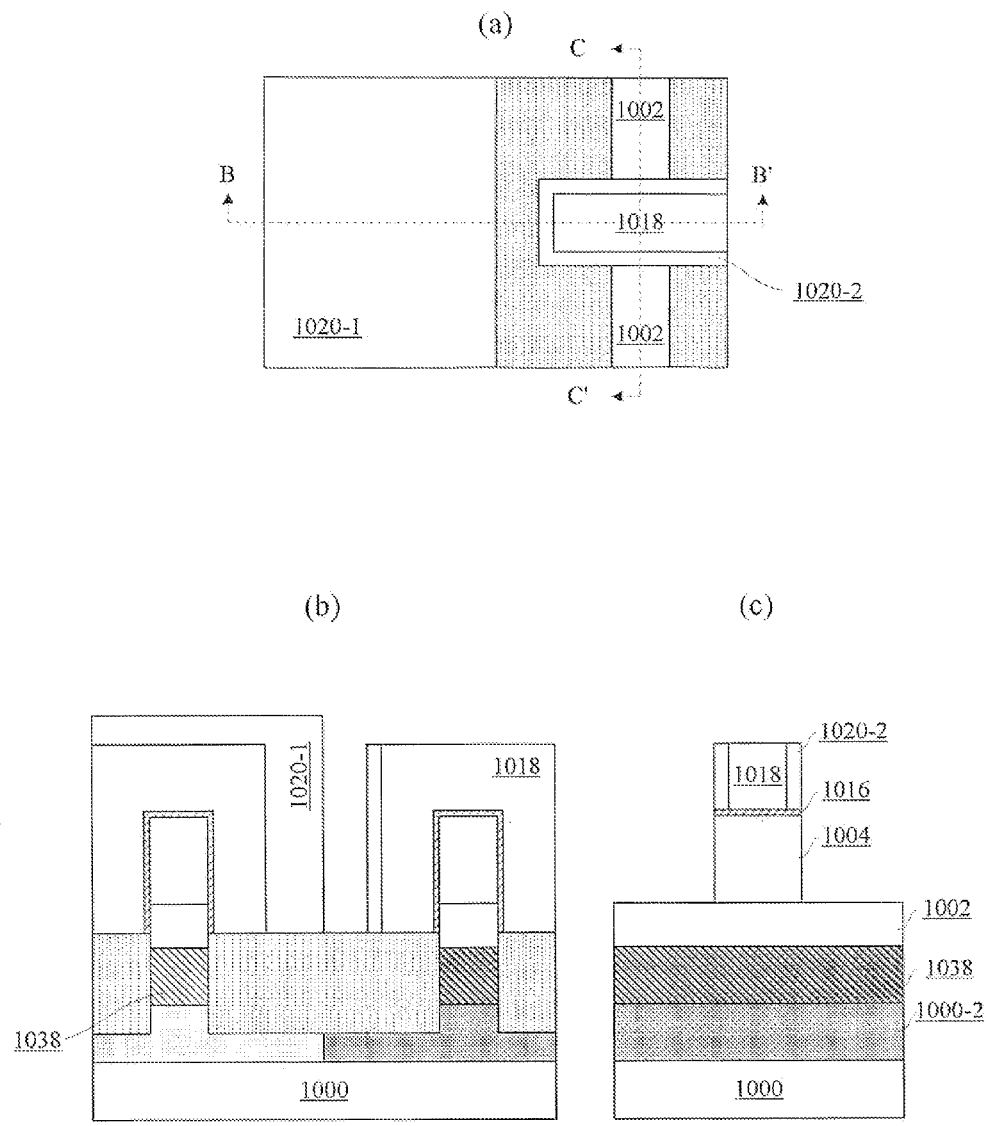

Next, as shown in FIG. 11 (FIG. 11(*b*) shows a cross-sectional view along line BB' in FIG. 11(*a*), and FIG. 11(*c*) shows a cross-sectional view along line CC' in FIG. 11(*a*)), exposed portions of the sacrificial gate dielectric layer 1016 may be removed selectively (by, for example, RIE). In a case where both the sacrificial gate dielectric layer 1016 and the isolation layer 1014 comprise oxide, the RIE of the sacrificial gate dielectric layer 1016 has substantially no influence on the isolation layer 1014, because the sacrificial gate dielectric layer 1016 is relatively thin. The process is not needed if the sacrificial gate dielectric layer has been further patterned with the sacrificial gate conductor layer as a mask in forming the sacrificial gate stack as described above.

Next, portions of the second semiconductor layer 1004 exposed due to the removal of the sacrificial gate dielectric layer 1016 may be selectively removed (by, for example, RIE). Due to the existence of the sacrificial gate stack (including the sacrificial gate dielectric layer, the sacrificial gate conductor, and the spacer), the second semiconductor layer 1004 may be left beneath the sacrificial gate stack. As a result, the first semiconductor layer 1002 is exposed.

Figure 12:
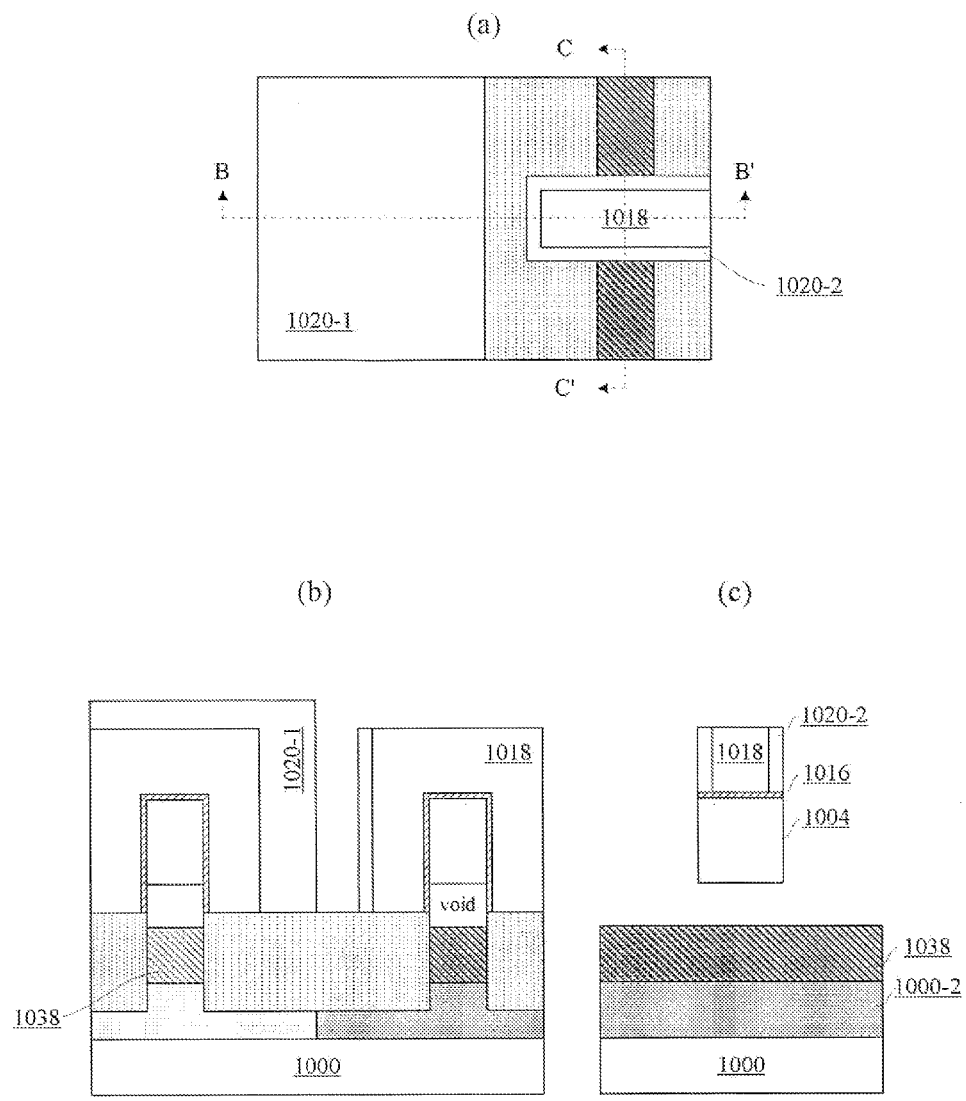

Next, as shown in FIG. 12 (FIG. 12(*b*) shows a cross-sectional view along line BB' in FIG. 12(*a*), and FIG. 12(*c*) shows a cross-sectional view along line CC' in FIG. 12(*a*)), the first semiconductor layer 1002 (for example, SiGe) may be selectively etched with respect to the second semiconductor layer 1004 and the substrate (for example, Si), to remove the first semiconductor layer. As such, a void is formed beneath the second semiconductor layer 1004. In addition, an opening is left in the isolation layer, which exposes the substrate 1000 (in the example, the opening exposes the punch-through stopper 1038).

Figure 13:
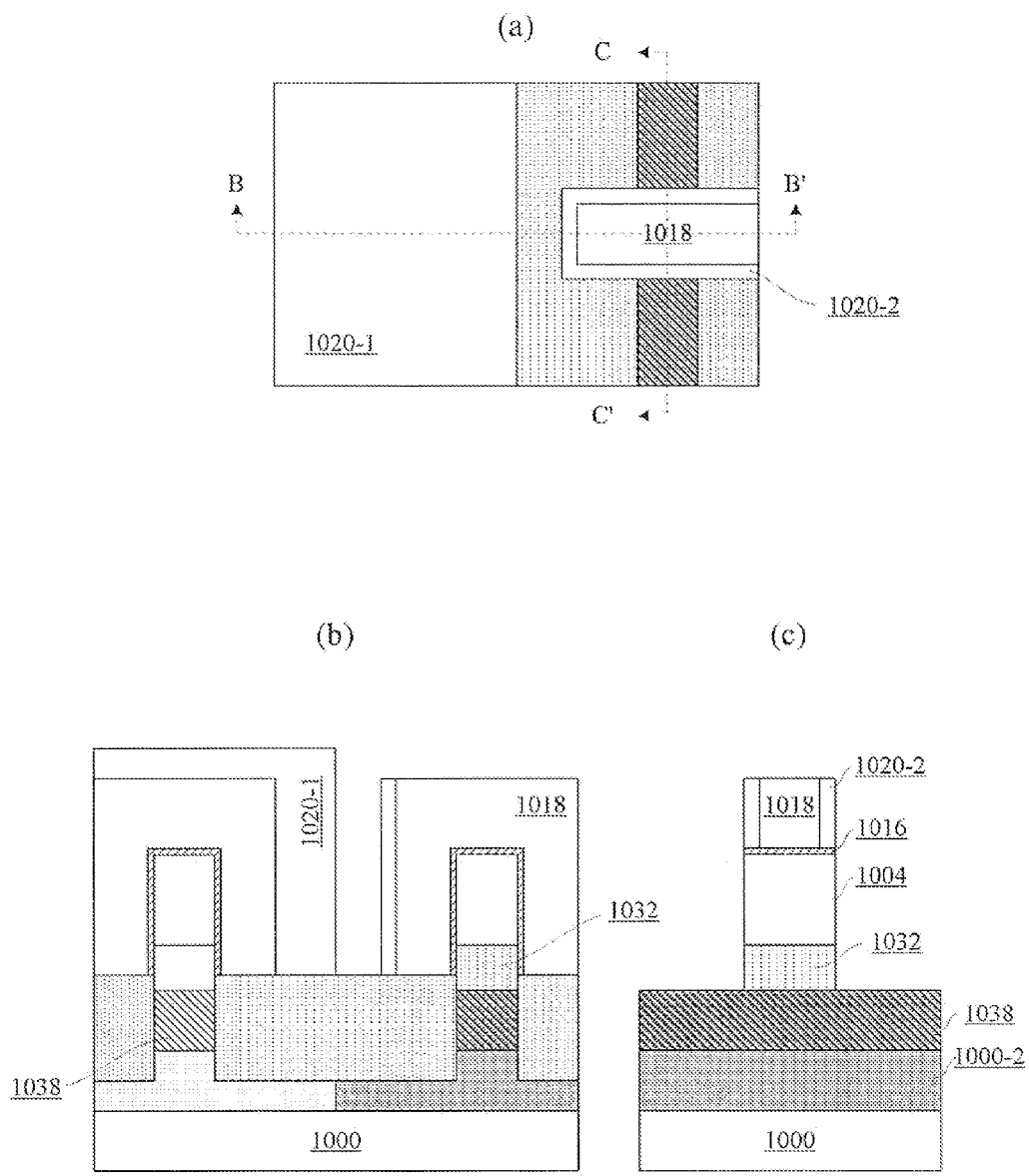

To further improve the device performances, as shown in FIG. 13 (FIG. 13(*b*) shows a cross-sectional view along line BB' in FIG. 13(*a*), and FIG. 13(*c*) shows a cross-sectional view along line CC' in FIG. 13(*a*)), the void formed beneath the second semiconductor layer 1004 may be filled with a dielectric material, to form an isolation island 1032. Specifically, the dielectric material (for example, oxide) may be deposited and then etched back, to expose the side walls of the fin (i.e., the second semiconductor layer 1004) (and preferably also expose the surface of the substrate 1000). As a result, the dielectric material is filled between the second semiconductor layer 1004 and the substrate 1000 to form the isolation island 1032.

Figure 14:
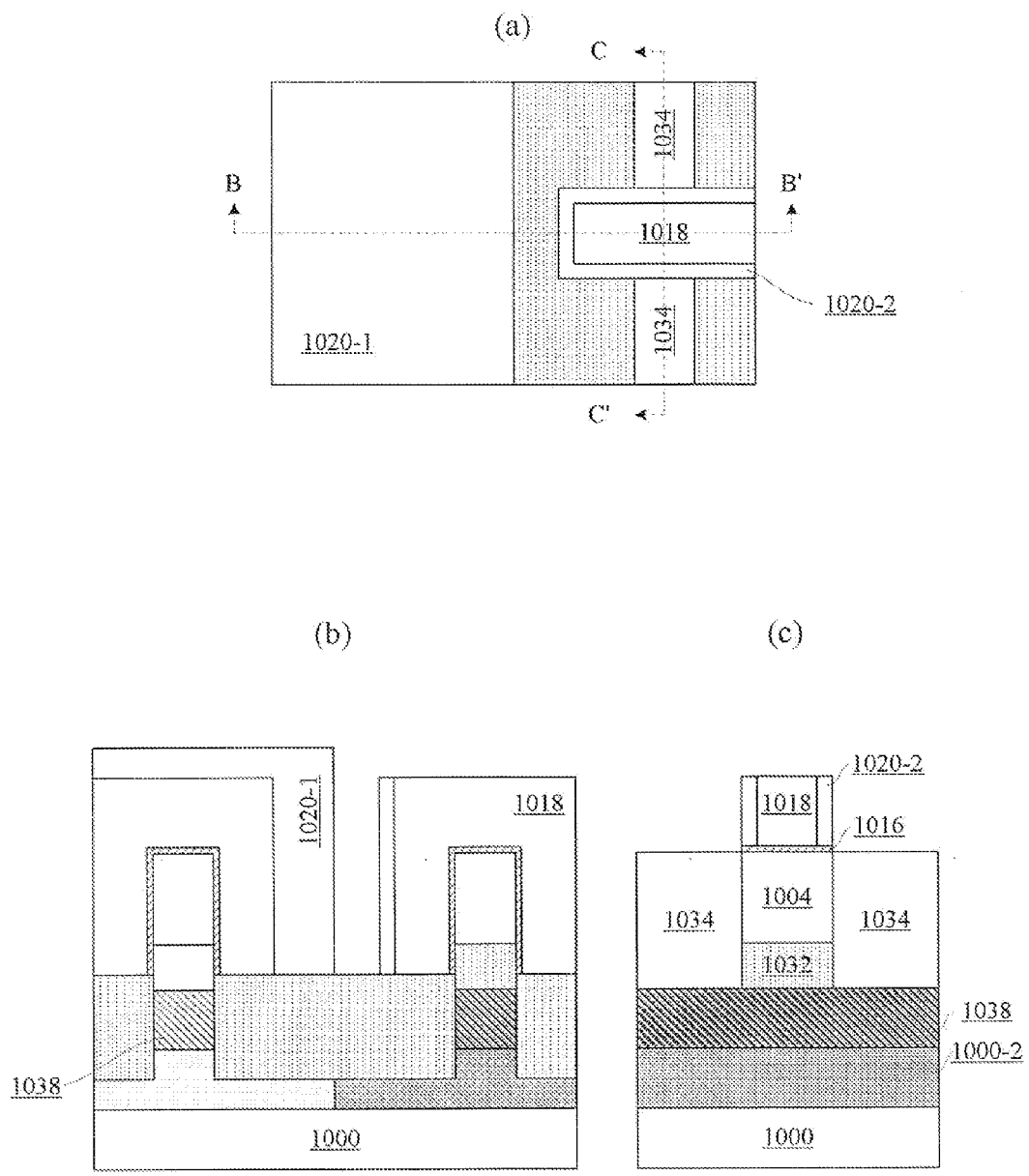

Then, a third semiconductor layer 1034 may be formed on the substrate by, for example, epitaxy, as shown in FIG. 14. Next, source/drain regions may be formed in the third semiconductor layer 1034. Due to the existence of the isolation layer and the spacer, the third semiconductor layer 1034 extends substantially from the side walls of the second semiconductor layer 1004 (specifically, the side walls on upper and lower sides in FIG. 14(*a*)). In an embodiment of the present disclosure, the third semiconductor layer 1034 may be doped in-situ while being grown. In an example, for the n-type device formed on the p-type well 1000-2, n-type doping may be performed. In addition, to further improve the performances, the third semiconductor layer 1034 may comprise a material different from that of the second semiconductor layer 1004, to apply stress to the second semiconductor layer 1004 (in which a channel of the device will be formed). In an example, in a case where the second semiconductor layer 1004 comprises Si, the third semiconductor layer 1034 may comprise Si:C (wherein C may have an atomic percentage of about 0.2-2%) to apply tensile stress.

As such, the second semiconductor layer 1004 together with the third semiconductor layer 1034 located on opposite sides thereof constitute a "fin" for the final device. In the fin, the channel may be formed in the second semiconductor layer 1004 beneath the gate stack, and the source/drain regions may be formed in the third semiconductor layer 1034. In addition, the isolation island 1032 may be formed between the source/drain regions at the bottom of the fin. The isolation island can significantly reduce a leakage current between the source and the drain via the bottom of the fin.

It is to be noted that the third semiconductor layer may also include some portions grown on the sacrificial gate conductor layer 1018 during the epitaxial growth if the sacrificial gate conductor layer 1018 comprises polysillion. Those portions may be removed in subsequent processes such as a planarization process, a gate replacement process or the like. For convenience, those portions are not shown here. In addition, the third semiconductor layer may be grown directly without forming the isolation island. As such, the second semiconductor layer 1004 may also be connected to the substrate via the third semiconductor layer at the bottom.

After the n-type device on the p-type well 1000-2 is processed as described above, similar processes may be performed for the p-type device on the n-type well 1000-1.

Figure 15:
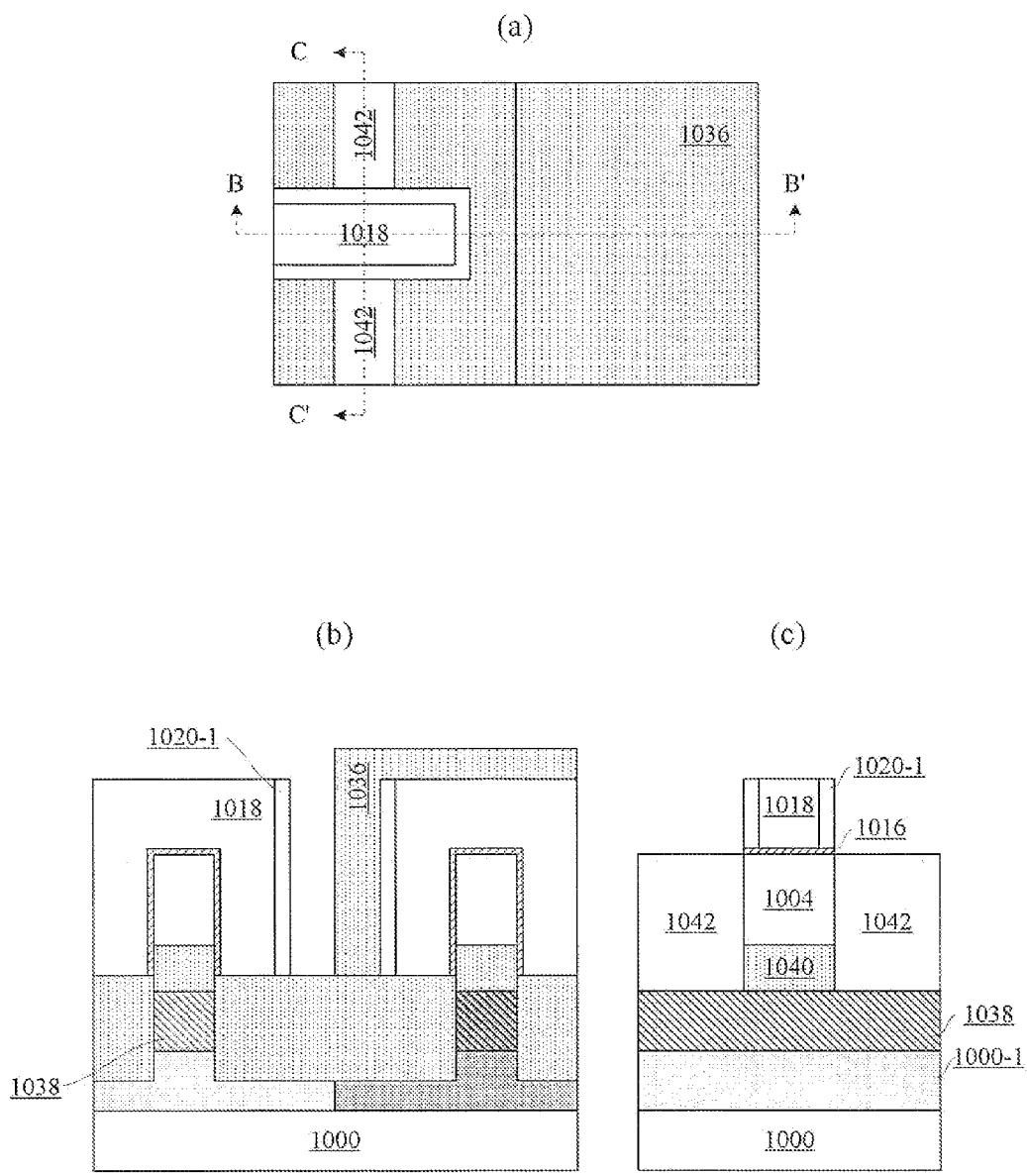

Specifically, as shown in FIG. 15, a further dielectric layer 1036 (for example, oxide) may be deposited, and then planarized by, for example, CMP, to expose the portion of the dielectric layer 1020-1 on the n-type well 1000-1. Then, RIE may be applied on the portion of the dielectric layer 1020-1 to form a spacer 1020-1.

Operations as described above in conjunction with FIGS. 11-14 may be performed on the p-type device on the n-type well 1000-1, with an exception that a further third semiconductor layer 1042 may be doped into p-type in situ and may comprise SiGe (wherein Ge may have an atomic percentage of about 15-75% for example) to apply compressive stress.

As shown in FIG. 15(*c*), for the p type device, the fin similarly includes the second semiconductor layer 1004 as well as the further third semiconductor layer 1042 located on opposite sides thereof. In the fin, a channel may be formed in the second semiconductor layer 1004 beneath the gate stack, and source/drain regions may be formed in the further third semiconductor layer 1042. In addition, an isolation island 1040 may be formed between the source/drain regions at the bottom of the fin. The isolation island can significantly reduce a leakage current between the source and the drain via the bottom of the fin.

After the source/drain regions of the n-type device and the p-type device are formed respectively as described above, the gate replacement process may be performed, to replace the sacrificial gate stack with a real gate stack for the final devices. For example, this may be done as follows.

Figure 16:
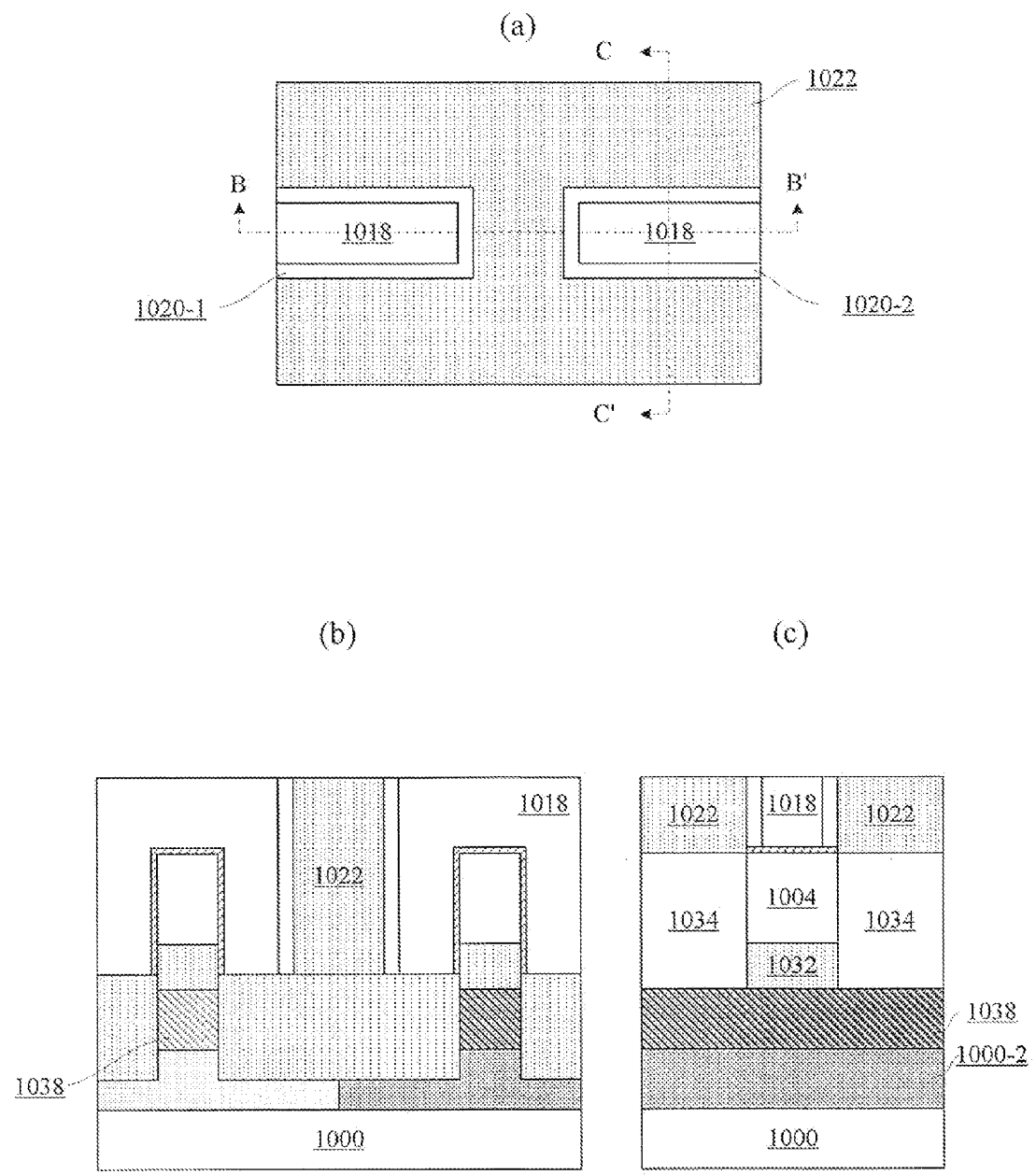

Next, as shown in FIG. 16 (FIG. 16 (*b*) shows a cross-sectional view along line BB' in FIG. 16(*a*), and FIG. 16(*c*) shows a cross-sectional view along line CC' in FIG. 16(*a*)), a dielectric layer 1022 may be formed through, for example, deposition. The dielectric layer 1022 may comprise oxide, for example. Then, the dielectric layer 1022 is planarized by, for example, CMP, which may stop at the spacers 1020-1 and 1020-2, thereby exposing the sacrificial gate conductor layer 1018.

Figure 17:
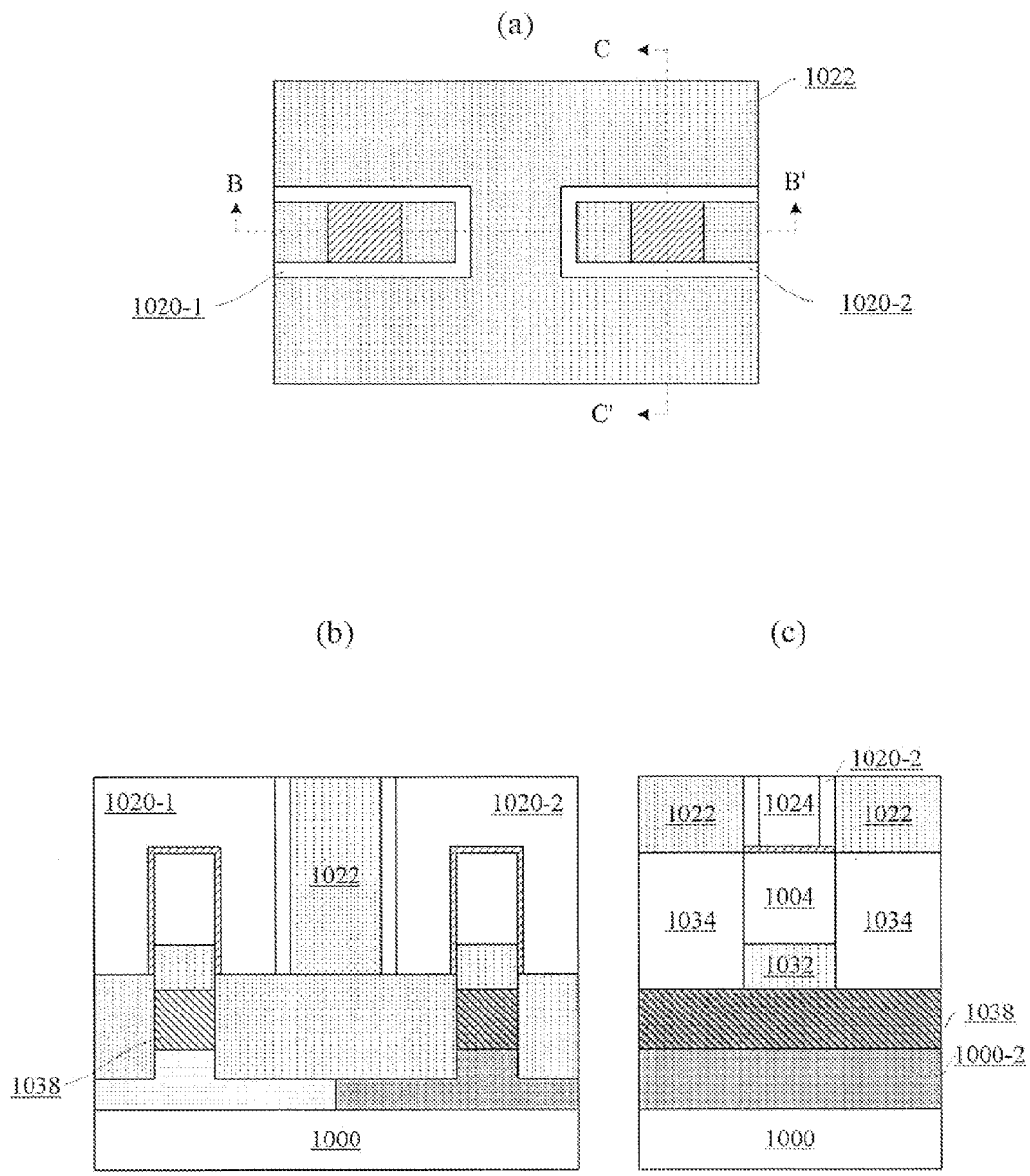

Subsequently, as shown in FIG. 17 (FIG. 17(b) shows a cross-sectional view along line BB' in FIG. 17(a), and FIG. 17(c) shows a cross-sectional view along line CC' in FIG. 17(a)), the sacrificial gate conductor layer 1018 may be selectively removed by, for example, a TMAH solution, and thus voids 1024 are formed within the respective spacers 1020-1 and 1020-2. In another example, the sacrificial gate dielectric layer 1016 may be further removed.

Figure 18:
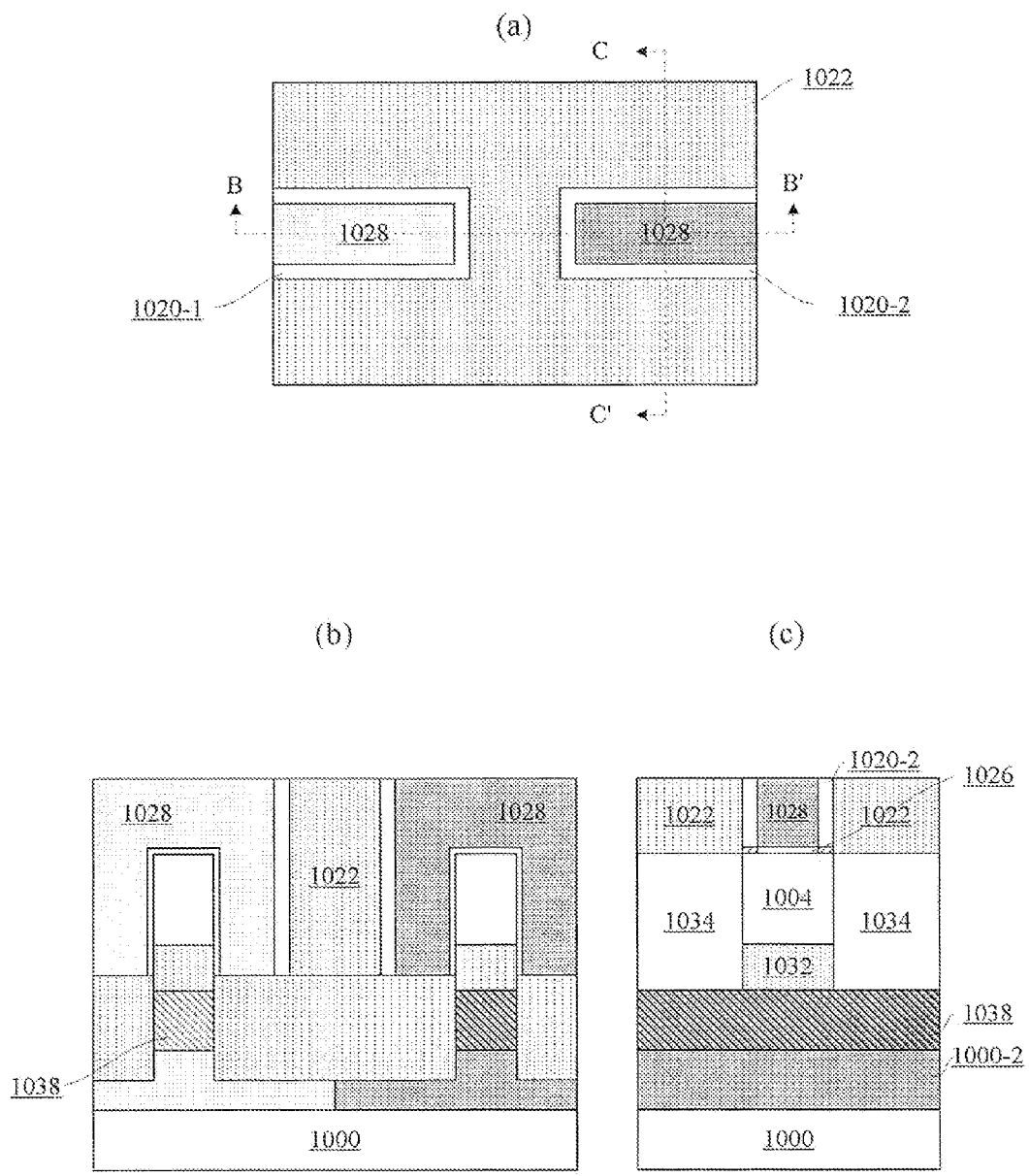

Next, as shown in FIG. 18 (FIG. 18(b) shows a cross-sectional view along line BB' in FIG. 18(a), and FIG. 18(c) shows a cross-sectional view along line CC' in FIG. 18(a)), a final gate stack is formed by forming a gate dielectric layer 1026 and a gate conductor layer 1028 in each of the voids 1024. The gate dielectric layer 1026 may comprise a high-K gate dielectric, such as $HfO_2$, with a thickness of about 1-5 nm. The gate conductor layer 1028 may comprise a metal gate conductor. Further, a work function adjustment layer (not shown) may be formed between the gate dielectric layer 1022 and the gate conductor layer 1024.

Although the gate dielectric layer 1026 is shown in FIG. 18 as a thin layer at the bottom of the void 1024, the gate dielectric layer 1026 may be also formed on sidewalls of the void 1024 and thus surrounds the gate conductor layer 1028.

As shown in FIG. 18, the semiconductor device according to the embodiment of the present disclosure may comprise the fin formed on the substrate. The punch-through stopper 1038 may be formed in the substrate beneath the fin. The fin may include a portion composed of the second semiconductor layer 1004 beneath the gate stack and also a portion composed of the third semiconductor layer 1034 or 1042 abutting the second semiconductor layer. The semiconductor device may further comprise the source/drain regions formed in the portion composed of the third semiconductor layer, the isolation layer formed on the semiconductor substrate, and the gate stack crossing over the fin formed on the isolation layer. The isolation island 1032 may be interposed between the portion composed of the second semiconductor layer 1004 and the substrate.

In case of the complementary process as described in the example, the n-type and p-type devices are processed respectively. To do this, the p-type device region on the left side is shielded by the dielectric layer portion 1020-1 to expose the n-type device region on the right side. However, the present disclosure is not limited thereto. For example, in the non-complementary process, such shielding may be omitted.

In addition, in the example, the p-type device region is firstly shielded and then the n-type device region is processed. However, the present disclosure is not limited thereto. An order in which the n-type device region and the p-type device region are processed may be exchanged.

In addition, in the above example, the gate replacement process is described. However, the present disclosure is not limited thereto. For example, the present disclosure is also applicable to a gate-first process.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

We claim:

1. A method for manufacturing a semiconductor device, comprising:
   forming a first semiconductor layer and a second semiconductor layer sequentially on a substrate;
   patterning the second semiconductor layer and the first semiconductor layer to form a fin;
   forming an isolation layer on the substrate, wherein the isolation layer exposes a portion of the first semiconductor layer;
   implanting ions into a portion of the substrate beneath the fin, to form a punch-through stopper;
   forming a gate stack crossing over the fin on the isolation layer;
   selectively etching the second semiconductor layer with the gate stack as a mask, to expose the first semiconductor layer;
   selectively etching the first semiconductor layer, to form a void beneath the second semiconductor layer; and
   forming a third semiconductor layer on the substrate, to form source/drain regions.

2. The method according to claim 1, wherein after selectively etching the first semiconductor layer, the method further comprises:
   filling the void with a dielectric material.

3. The method according to claim 1, wherein forming an isolation layer comprises:
   depositing on the substrate a dielectric material substantially covering the fin, wherein a portion of the dielectric material on top of the fin has a thickness sufficiently less than that of a portion of the dielectric material on the substrate; and
   etching back the dielectric material.

4. The method according to claim 3, wherein the portion of the dielectric material on top of the fin has a thickness less than ⅓ of the thickness of the portion of the dielectric material on the substrate.

5. The method according to claim 3, wherein the dielectric material is formed by High Density Plasma (HDP) deposition.

6. The method according to claim 3, wherein a plurality of fins are formed on the substrate, and a portion of the dielectric material on top of each of the fins has a thickness less than ½ of a spacing between the fin and its neighboring fin.

7. The method according to claim 1, wherein before patterning the fin, the method further comprises:
   forming a protection layer on the second semiconductor layer.

8. The method according to claim 3, wherein before patterning the fin, the method further comprises:
   forming a protection layer on the second semiconductor layer,
   wherein the protection layer comprises the same dielectric material as the isolation layer.

9. The method according to claim 1, wherein forming a punch-through stopper comprises:
   performing n-type implantation for a p-type device, or performing p-type implantation for an n-type device.

10. The method according to claim 1, wherein the third semiconductor layer is doped in situ while being formed.

11. The method according to claim 1, wherein the third semiconductor layer is compressive stressed for a p-type device or tensile stressed for an n-type device.

12. The method according to claim 11, wherein the substrate comprises Si, the first semiconductor layer comprises SiGe, the second semiconductor layer comprises Si, and the third semiconductor layer comprises SiGe or Si:C.

13. The method according to claim 1, wherein the gate stack is a sacrificial gate stack, and the method further comprises removing the sacrificial gate stack and forming a further gate stack by a gate replacement process.

14. A semiconductor device, comprising:
a fin formed on a substrate;
a punch-through stopper formed in the substrate beneath the fin;
an isolation layer formed on the substrate; and
a gate stack formed on the isolation layer and crossing over the fin,
wherein the fin comprises a portion composed of a first semiconductor layer beneath the gate stack and a portion composed of a second semiconductor layer abutting the first semiconductor layer, and
wherein the semiconductor device further comprises source/drain regions formed in the portion composed of the second semiconductor layer and the isolation layer has a top surface lower than a bottom surface of the portion composed of the first semiconductor layer.

15. The semiconductor device according to claim 14, further comprising an isolation island formed between the portion composed of the first semiconductor layer and the substrate.

16. The semiconductor device according to claim 14, wherein the substrate comprises Si, the first semiconductor layer comprises Si, and the second semiconductor layer comprises SiGe or Si:C.

17. The semiconductor device according to claim 14, wherein the portion composed of the second semiconductor layer is formed on a surface of the substrate through an opening in the isolation layer.

18. A semiconductor device, comprising:
a fin formed on a substrate;
a punch-through stopper formed in the substrate beneath the fin;
an isolation layer formed on the substrate; and
a gate stack formed on the isolation layer and crossing over the fin,
wherein the fin comprises a portion of a first semiconductor layer beneath the gate stack and a portion composed of a second semiconductor layer abutting the first semiconductor layer, and
an isolation island formed between the portion composed of the first semiconductor layer and the substrate;
wherein the semiconductor device further comprises source/drain regions formed in the portion composed of the second semiconductor layer.

19. The semiconductor device according to claim 18, wherein the isolation layer has a top surface lower than a bottom surface of the portion composed of the first semiconductor layer.

20. The semiconductor device according to claim 18, wherein the substrate comprises Si, the first semiconductor layer comprises Si, and the second semiconductor layer comprises SiGe or Si:C.

* * * * *